United States Patent [19]
Chiu

[11] Patent Number: 6,162,332
[45] Date of Patent: Dec. 19, 2000

[54] METHOD AND APPARATUS FOR PREVENTING ARCING IN SPUTTER CHAMBER

[75] Inventor: Chia-Yung Chiu, Tao-Yuan, Taiwan

[73] Assignee: Taiwan Semiconductor Manufacturing Company, Ltd., Hsin Chu, Taiwan

[21] Appl. No.: 09/499,606

[22] Filed: Feb. 7, 2000

Related U.S. Application Data

[63] Continuation-in-part of application No. 09/074,344, May 7, 1998, abandoned.

[51] Int. Cl.[7] .................................................. C23C 14/34
[52] U.S. Cl. ........................ 204/192.13; 204/192.12; 204/298.03; 204/298.08; 204/298.11
[58] Field of Search ........................ 204/192.12, 192.13, 204/298.03, 298.08, 298.11

[56] References Cited

U.S. PATENT DOCUMENTS

| | | | |
|---|---|---|---|
| 5,108,570 | 4/1992 | Wang | 204/192.3 |
| 5,116,482 | 5/1992 | Setoyama et al. | 204/298.08 |
| 5,241,152 | 8/1993 | Anderson et al. | 204/298.03 |
| 5,281,321 | 1/1994 | Sturmer et al. | 204/298.08 |
| 5,294,320 | 3/1994 | Somekh et al. | 204/298.11 |
| 5,303,139 | 4/1994 | Mark | 204/298.08 |
| 5,427,669 | 6/1995 | Drummond | 204/298.08 |
| 5,431,799 | 7/1995 | Mosley et al. | 204/298.06 |
| 5,611,899 | 3/1997 | Maass | 204/298.08 |
| 5,660,700 | 8/1997 | Shimizu et al. | 204/298.08 |
| 5,682,067 | 10/1997 | Manley et al. | 204/192.12 |
| 5,698,082 | 12/1997 | Teschner et al. | 204/298.03 |
| 5,772,858 | 6/1998 | Tepman | 204/192.12 |
| 5,882,492 | 3/1999 | Manley et al. | 204/298.08 |

*Primary Examiner*—Nam Nguyen
*Assistant Examiner*—Gregg Cantelmo
*Attorney, Agent, or Firm*—Tung & Associates

[57] ABSTRACT

A method and an apparatus for preventing arcing in a sputter chamber by utilizing a first ground detection circuit, a second ground detection circuit and an interlock circuit are disclosed. The first ground detection circuit is utilized to detect the existence of a grounding condition between a clamp ring and a chamber shield positioned in a sputter chamber after reactant gases are flown into the chamber. The first ground detection circuit is capable of outputting a first signal to an interlock circuit when a grounding condition is detected to interrupt a power supply to the sputter chamber. The second ground detection circuit is utilized for detecting the existence of a grounding condition between a clamp ring and a chamber shield after a plasma for deposition is ignited in the sputter chamber. The second ground detection circuit is also capable of outputting a second signal to an interlock circuit when a grounding condition is detected to interrupt a power supply to the sputter chamber. The apparatus further includes an interlock circuit for receiving a first signal or a second signal and then outputting a third signal to interrupt a power supply to a sputter chamber before the occurrence of an arcing condition.

28 Claims, 4 Drawing Sheets

METHOD AND APPARATUS FOR PREVENTING ARCING IN SPUTTER CHAMBER

RELATED APPLICATIONS

This is a continuation-in-part (CIP) application of U.S. patent application Ser. No. 09/074,344, filed May 7, 1998, abandoned May 4, 2000.

FIELD OF THE INVENTION

The present invention generally relates to a method and apparatus for preventing arcing in a sputter chamber used in semiconductor processing and more particularly, relates to a method and apparatus for preventing arcing in a metal sputter chamber for processing silicon wafers by utilizing a first ground detection circuit for detecting the occurrence of a grounding condition between a clamp ring and a chamber shield after reactant gases are flown into the sputter chamber, and a second ground detection circuit for detecting the existence of a grounding condition between the clamp ring and the chamber shield after a plasma is ignited in the sputter chamber for deposition wherein a signal sent by either the first or the second ground detection circuit is received by an interlock circuit to interrupt a power supply to the sputter chamber before an arcing condition can occur.

BACKGROUND OF THE INVENTION

Physical vapor deposition (PVD) or sputter deposition is a frequently used processing technique in the manufacturing of semiconductor devices that involves the deposition of a metallic layer on the surface of a semiconductor device. The physical vapor deposition technique is more frequently known as a sputtering technique. In more recently developed semiconductor fabrication processes, the sputtering technique is used to deposit metallic layers of tungsten or titanium tungsten as contact layers.

In a sputtering process, inert gas particles such as those of argon or nitrogen, are first ionized in an electric field to produce a gas plasma and then attracted toward a source or a target where the energy of the gas particles physically dislodges, i.e., sputters off, atoms of the metallic or other source material. The sputtering technique is very versatile in that various materials can be deposited utilizing not only RF but also DC power sources.

In a typical sputter chamber, the major components utilized include a stainless steel chamber that is vacuum-tight and is equipped with a helium leak detector, a pump that has the capacity to reduce the chamber pressure to at least $10^{-6}$ torr or below, various pressure gauges, a sputter source or target, a RF or DC power supply, a wafer holder, a chamber shield and a clamp ring. The sputter source is normally mounted on the roof of the chamber such that it faces a wafer holder positioned in the center of the chamber facing each other. The sputter source utilized can be a W or TiW disc for a process in which W or TiW is sputtered. A typical sputter chamber is that supplied by the Applied Materials, Inc. of Santa Clara, Calif. under the trade name of Endura® 5500. In some of the sputter chambers, the wafer holder is structured as a pedestal which includes an internal resistive heater.

One of the more important component in the sputter chamber is the clamp ring which serves two purposes during a sputter process. The first purpose is to clamp the wafer to the pedestal heater. The clamp ring holds the wafer in place on the pedestal when a positive gas pressure is applied between the heater and the pedestal such that heat can be efficiently conducted from the heater to the wafer. The second purpose served by the clamp ring is to allow a predetermined flow of argon to leak from under the wafer into the sputter chamber. The clamp ring is generally constructed in a circular shape with an oriented cut-out to match a wafer's flat contour. A hood is built into the clamp ring and is used for shadowing purpose to protect the lip of the clamp ring from being coated by the sputtered metal particles. The lip portion also allows the force of the clamp ring to be evenly distributed around the wafer.

A cross-sectional view of a typical sputter chamber 10 is shown in FIG. 1. Sputter chamber 10 is constructed by a stainless steel chamber body 12 that is vacuum-tight, a sputter target 16 of W, TiW or Sn, a wafer holder 20 equipped with a heater 22, a wafer lift mechanism 24, a wafer port 28, a pumping port 32, a clamp ring 30 and a chamber shield 34. A DC power supply 25 is connected to a target 21 and a conductive part of the chamber, such as the chamber wall 18 or chamber shield 34, thereby establishing a voltage potential between the grounded chamber wall 18 and the target 21. A DC bias circuit 23 is connected to the clamping ring and thus applies a DC bias to the wafer (not shown). A perspective view of the clamp ring 30 and the chamber shield 34 is shown in FIG. 1A. An enlarged, partial cross-sectional view of the clamp ring 30 and the chamber shield 34 is shown in FIG. 1B. The hood 36 of the clamp ring 30 protects the tip 38 from being coated by the sputtered particles.

As shown in FIG. 1, the chamber shield 34 is another important component in the sputter chamber 10. It forms a seal between the clamp ring 30 and the chamber body 12 such that sputtered particles from the sputter target 16 do not contaminate the chamber wall 18 during a sputtering process. It should be noted that, during the sputtering process, the wafer pedestal 20 is in a raised position with the tip portion 38 of the clamp ring 30 touching the heater 22 on the pedestal 20. In order to achieve a tight seal from the chamber wall 18, a small gap 40 is normally maintained between the clamp ring 30 and the chamber shield 34.

In a typical metal sputtering process where a W, TiW, Sn or other metal target is used in the sputter chamber, the emission of sputtered particles of the metals is shaped with a forward cosine distribution such that a more desirable deposition process in which metal particles are deposited uniformly at the center and the edge of the wafer can be achieved. However, due to the small gap 40 maintained between the clamp ring 30 and the chamber shield 34, and after successive deposition processes have been conducted in the chamber, a distortion in the chamber shield 34 may lead to arcing problems occurring in the chamber. The arcing problem may occur in one of two situations. First, after the reactant gas such as Ar or $N_2$ is flown into the chamber, thermal expansion between already distorted parts further reduces the gap between the clamp ring and the chamber shield such that arcing occurs. The second situation occurs after plasma is turned on to ignite a plasma cloud of the metal particles. Since plasma generates a large amount of heat, a distorted chamber shield may further expand to reduce its distance from the clamp ring and thus cause arcing. When arcing occurs under either circumstances, severe damage in the form of particle contamination can occur on the wafer positioned on the pedestal which can cause a significant part of the wafer or even the entire wafer to be scrapped.

Sputter chamber designers have attempted to prevent arcing problem in a sputtering process by making modifications to the chamber component. However, none of these modifications have proven to be effective in reducing distortions in the components after successive usage of the chamber and thus the arcing problem can not be effectively controlled.

It is therefore an object of the present invention to provide a novel method and apparatus for preventing arcing in sputter chambers that do not have the drawbacks and shortcomings of the conventional method and apparatus.

It is another object of the present invention to provide an apparatus for preventing arcing in a sputter chamber by providing a ground detection circuit to the chamber hardware such that a grounding condition of the wafer pedestal can be effectively detected prior to the occurrence of arcing.

It is a further object of the present invention to provide an apparatus for preventing arcing in a sputter chamber equipped with ground detection circuits for detecting the existence of a grounding condition between a clamp ring and a chamber shield.

It is another further object of the present invention to provide an apparatus for preventing arcing in a sputter chamber by providing separate ground detection circuits for detecting the existence of a grounding condition during a reactant gas flow process and during a plasma deposition process.

It is still another object of the present invention to provide an apparatus for preventing arcing in a sputter chamber by utilizing a ground detection circuit for detecting the occurrence of a grounding condition such that a power supply to the sputter chamber can be interrupted prior to the occurrence of arcing.

It is yet another object of the present invention to provide an apparatus for preventing arcing in a sputter chamber by utilizing a first ground detection circuit for detecting a grounding condition during a reactant gas flow process, a second ground detection circuit during a plasma ignition process, and an interlock circuit for receiving signals from either one of the ground detection circuits such that a power supply to the sputter chamber can be interrupted prior to the occurrence of arcing.

It is still another further object of the present invention to provide a method for preventing arcing in a sputter chamber by providing a first ground detection circuit, a second ground protection circuit and an interlock circuit such that a power supply to the sputter chamber can be interrupted when a grounding condition is detected by the detection circuits.

It is yet another further object of the present invention to provide a method for preventing arcing in a sputter chamber by monitoring the magnitude of a DC bias voltage on a wafer pedestal during a reactant gas flow process and during a plasma ignition process.

SUMMARY OF THE INVENTION

In accordance with the present invention, a method and apparatus for preventing arcing in sputter chamber by utilizing circuits for detecting a grounding condition between a clamp ring and a chamber shield are provided.

In a preferred embodiment, an apparatus for preventing arcing in a sputter chamber is provided which includes a first ground detection circuit for detecting the existence of a grounding condition between a clamp ring and a chamber component after reactant gases are flown into the sputter chamber, the first ground detection circuit is adapted for outputting a first signal to an interlock circuit when a grounding condition is detected to interrupt a power supply to the sputter chamber, a second ground detection circuit for detecting the existence of a grounding condition between the clamp ring and the chamber component after a plasma for deposition is formed in the sputter chamber, the second ground detection circuit is adapted for outputting a second signal to an interlock circuit when a grounding condition is detected to interrupt a power supply to the sputter chamber, and an interlock circuit for receiving the first signal or the second signal and outputting a third signal to interrupt a power supply to the sputter chamber before the occurrence of an arcing condition.

The first ground detection circuit is operational when reactant gases are flown into the chamber while the second ground detection circuit is operational when plasma is turned on for deposition. The first ground detection circuit may be operational during a reactant gas turned-on period for between about 5 seconds and about 10 seconds. The second ground detection circuit may be operational only after reactant gases have been turned on for about 10 seconds. The first ground detection circuit operates by detecting a DC bias voltage on a wafer pedestal such that a first signal to an interlock circuit is outputted when the voltage detected is substantially below −24V. The second ground detection circuit operates by detecting a DC bias voltage on a wafer pedestal such that a second signal to the interlock circuit is outputted when the voltage detected is substantially below −27V. The first ground detection circuit may further operate by detecting a DC bias voltage on a wafer pedestal such that a first signal to an interlock circuit is outputted when the voltage detected is substantially zero. The second ground detection circuit may further operate by detecting a DC bias voltage on a wafer pedestal such that a second signal to the interlock circuit is outputted when the voltage detected is substantially zero. The first ground detection circuit is an instantaneous detection circuit while the second ground detection circuit is a delayed detection circuit. The interlock circuit may include an "OR" logic gate for outputting a third signal to interrupt a power supply to the sputter chamber when either a first signal or a second signal is received by the interlock circuit. The first and the second ground detection circuits include at least a timer and a relay. The chamber component on which a grounding detection is made can be a chamber shield.

The present invention is further directed to a method for preventing arcing in a sputter chamber that can be carried out by the operating steps of first providing a first ground detection circuit for detecting a grounding condition between a clamp ring and a chamber component, then flowing a reactant gas into the chamber while simultaneously activating the first ground detection circuit for at least 5 seconds, then outputting a first signal to an interlock circuit to interrupt a power supply to the chamber when a grounding condition is detected, then providing a second ground detection circuit for detecting a grounding condition between a clamp ring and a chamber component, turning on a plasma source for sputter deposition in the chamber after the first ground detection circuit is deactivated, outputting a second signal to an interlock circuit to interrupt a power supply to the chamber when a grounding condition is detected, and providing an interlock circuit for outputting a third signal to interrupt a power supply to the sputter chamber upon receiving the first signal or the second signal.

The chamber component can be a chamber shield positioned juxtaposed to the clamp ring. The first ground detection circuit is activated for a time period between about 5 seconds and about 10 seconds after gas is turned on. The plasma source can be turned on for sputter deposition for a time period between about 20 seconds and about 70 seconds during which time the second ground detection circuit is activated. The second ground detection circuit can be activated only after the first ground detection circuit is deactivated. The method may further include the step of outputting a first signal from the first ground detection circuit to the interlock circuit when a DC bias voltage on a wafer pedestal is detected to be substantially below −24V. The method may further include the step of outputting a second signal from the second ground detection circuit to the interlock circuit when a DC bias voltage on a wafer pedestal is detected to be substantially below −27V. The method may further include the step of outputting a first or a second signal from the first or second ground detection circuit respectively to the interlock circuit when a DC bias voltage on a wafer pedestal is detected to be substantially zero.

In another preferred embodiment, an apparatus for preventing arcing between a clamp ring and a chamber shield in a sputter chamber can be provided which includes a sputter chamber, a clamp ring and a chamber shield situated in the chamber, a first ground detection circuit for detecting the occurrence of a grounding condition between the clamp ring and the chamber shield by monitoring a DC bias voltage on a wafer pedestal and outputting a first signal to an interlock circuit. The first ground detection circuit is activated during a first time period when reactant gases are flown into the chamber, a second ground detection circuit for detecting the occurrence of a grounding condition between the clamp ring and the chamber shield by monitoring a DC bias voltage on a wafer pedestal and outputting a second signal to an interlock circuit, the second ground detection circuit is activated during a second time period when plasma power is turned on to ignite a gas plasma in the chamber, and an interlock circuit adapted for receiving the first signal or the second signal and outputting a third signal to interlock a power supply to the sputter chamber before the occurrence of arcing.

The clamp ring and the chamber shield are formed of an electrically conductive material such as stainless steel. The first signal is outputted from the first ground detection circuit when a DC bias voltage monitored on the wafer pedestal is substantially less than −24V. The first time period during which the first ground detection circuit is activated is between about 5 seconds and about 10 seconds after the reactant gas flow is turned on. The second signal is outputted from the second ground detection circuit when the DC bias voltage monitored on the wafer pedestal is substantially less than −27V. The second time period during which the second ground detection circuit is activated is between about 20 seconds and about 70 seconds after the plasma source is turned on to ignite a plasma in the sputter chamber. The first signal or the second signal can be outputted from the first or the second ground detection circuit when the DC bias voltage monitored on the wafer pedestal is substantially zero. The second ground detection circuit is a delayed circuit which is activated only after the first ground detection circuit is first deactivated.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method and an apparatus for preventing arcing in a sputter chamber by utilizing ground detection circuits to detect the existence of a grounding condition by monitoring a DC bias voltage on a wafer pedestal such that when the DC bias voltage is substantially zero, the ground detection circuits send a signal to an interlock circuit to interrupt a power supply to the sputter chamber before the occurrence of arcing. The present invention novel method can be carried out in a two stage process, i.e., a first stage detection process is conducted during an reactant gas flow into the sputter chamber, while a second stage detection process is conducted during plasma deposition in the sputter chamber. The first stage detection is conducted after a turn-on of the reactant gas for a time period of at least 5 seconds, and preferably between about 5 seconds and about 10 seconds. The second stage detection process is carried out after the first stage detection is deactivated and thus, is turned on only after a delayed time period of at least 10 seconds. The second stage detection is carried out for a time period between about 20 seconds and about 70 seconds, depending on the thickness of the sputtered film desired. While the sputter deposition of Sn is illustrated in a preferred embodiment, the present invention novel method and apparatus can be utilized in depositing any metal films in a sputter chamber.

Figure 1:
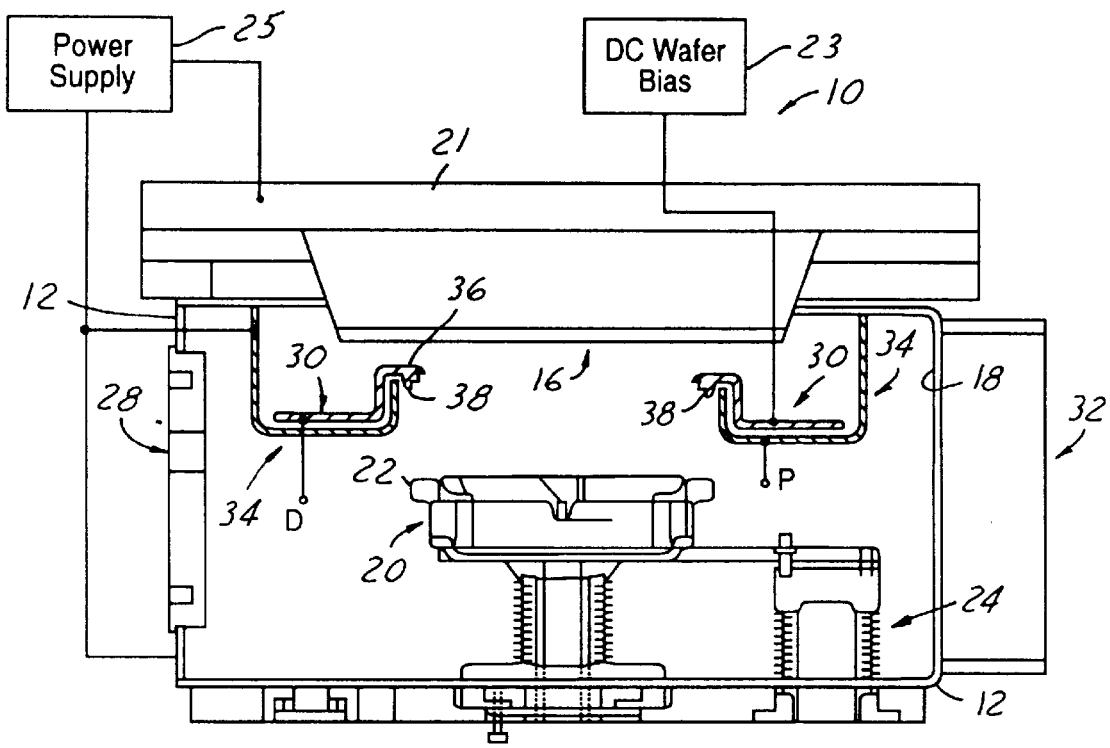
FIG. 1 is a cross-sectional view of a conventional sputter chamber equipped with a clamp ring and a chamber shield.
Figure 1A:
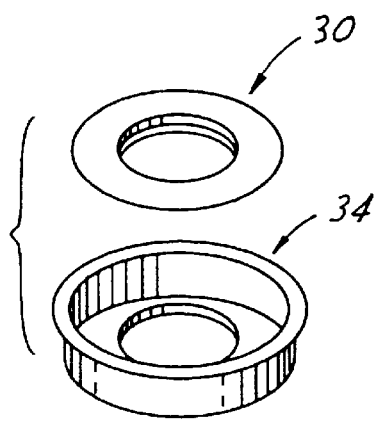
FIG. 1A is a perspective view of the clamp ring and the chamber shield.
Figure 1B:
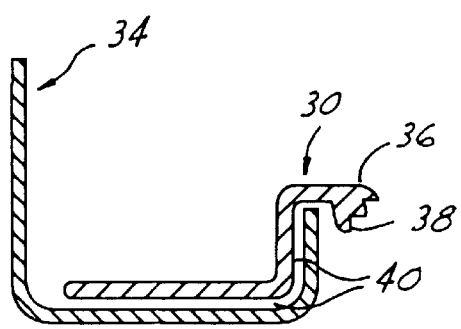
FIG. 1B is an enlarged, partial cross-sectional view of the clamp ring and the chamber shield.
Figure 2:
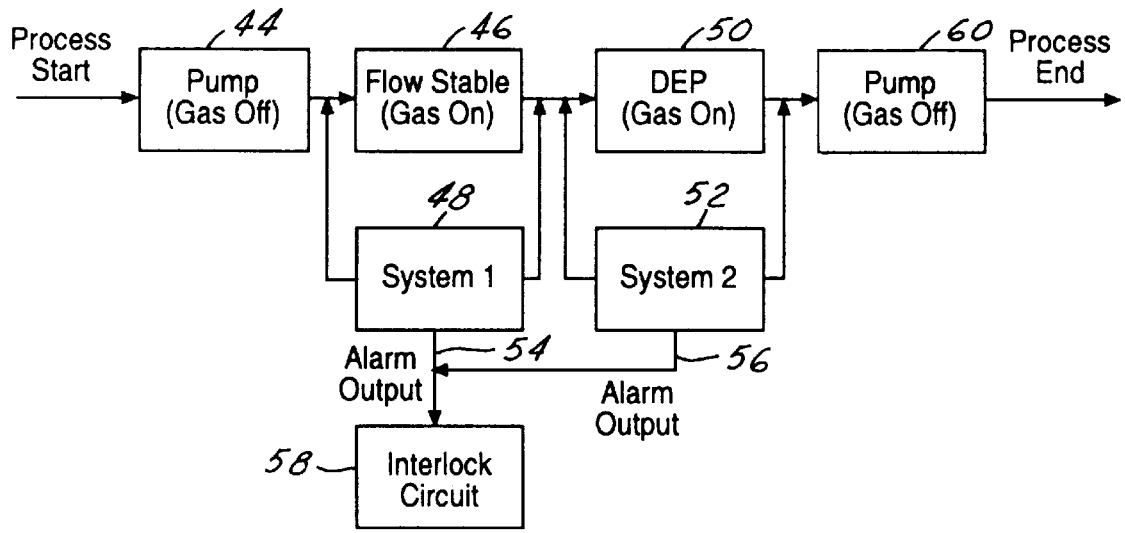
FIG. 2 is a block diagram showing a wafer process flow in a sputter deposition chamber.

Referring now to FIG. 2, wherein it is shown a block diagram for a present invention wafer process flow in a sputter chamber. At the beginning of the process, as indicated by block 44, a wafer is positioned into the sputter chamber through wafer port 28 (FIG. 1). The wafer, positioned on the wafer pedestal 20 (FIG. 1) is then raised to a process position with the heater 22 touching the lip portion 38 of the clamp ring 30. At this time, the chamber is pumped down by a pump means (not shown) through the pumping port 32. During the pumping process, the reactant gas is turned off.

After the sputter chamber is pumped down to a desirable pressure, a reactant gas such as Ar or $N_2$ is flown into the chamber until an optimum condition for igniting a plasma is reached. This is shown as block 46. When the reactant gas flow is turned on, the first ground detection circuit, i.e., block 48 is activated simultaneously. As soon as block 48 receives a gas turn-on signal from block 46, the first ground detection circuit is activated for detecting any possible grounding condition. The detection process is continued for a time period between about 5 seconds and about 10 seconds, prior to the turn-on of the plasma.

At the end of the first time period of between about 5 seconds and about 10 seconds, the plasma power in the sputter chamber is turned on to ignite a plasma for deposition. This is shown as block 50. Simultaneously, the ground detection task is passed on from the first ground detection circuit 48 to the second ground detection circuit 52. The second ground detection circuit 52 is therefore activated only after the first ground detection circuit 48 is deactivated. During the time the ground detection task is carried out by either the first circuit 48 or the second circuit 52, an alarm output 54 or 56 can be produced respectively and outputted to an interlock circuit, as indicated by block 58. The interlock circuit 58, once received an alarm output 54 or 56, outputs a signal to interrupt a power supply to the sputter chamber prior to the occurrence of any arcing. After a suitable time period for the plasma deposition process, i.e., between about 20 seconds and about 70 seconds, the reactant gas flow to the sputter chamber is turned off while the chamber is pumped down through the pumping outlet 32 (FIG. 1) prior to the removal of the wafer from the chamber. This is shown in block 60. The time required for the plasma deposition process is dependent on the thickness of the sputtered film desired. The thicker the film required, the longer the plasma deposition time.

Figure 4:
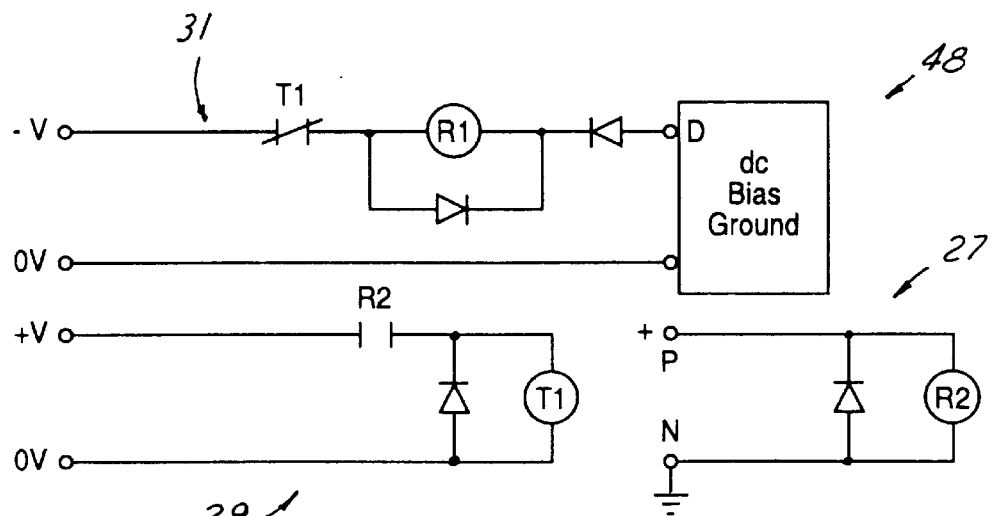
FIG. 4 is a circuit diagram for the present invention first ground detection circuit during a reactant gas flow.
Figure 6:
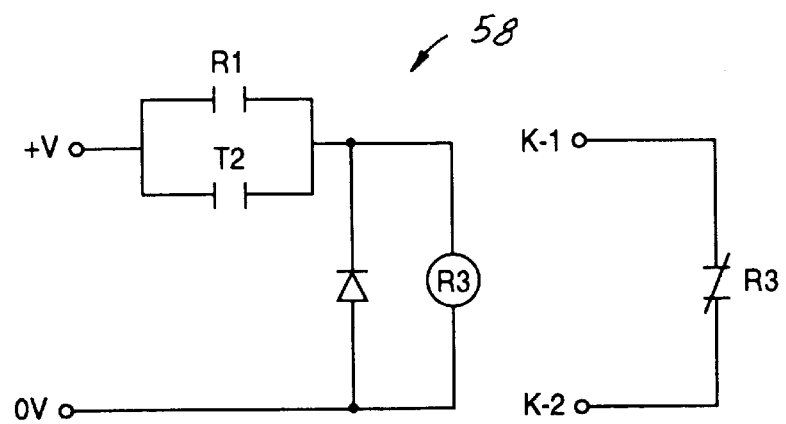
FIG. 6 is a circuit diagram illustrating the present invention interlocking system for interrupting a power supply to the sputter chamber.
Figure 7:
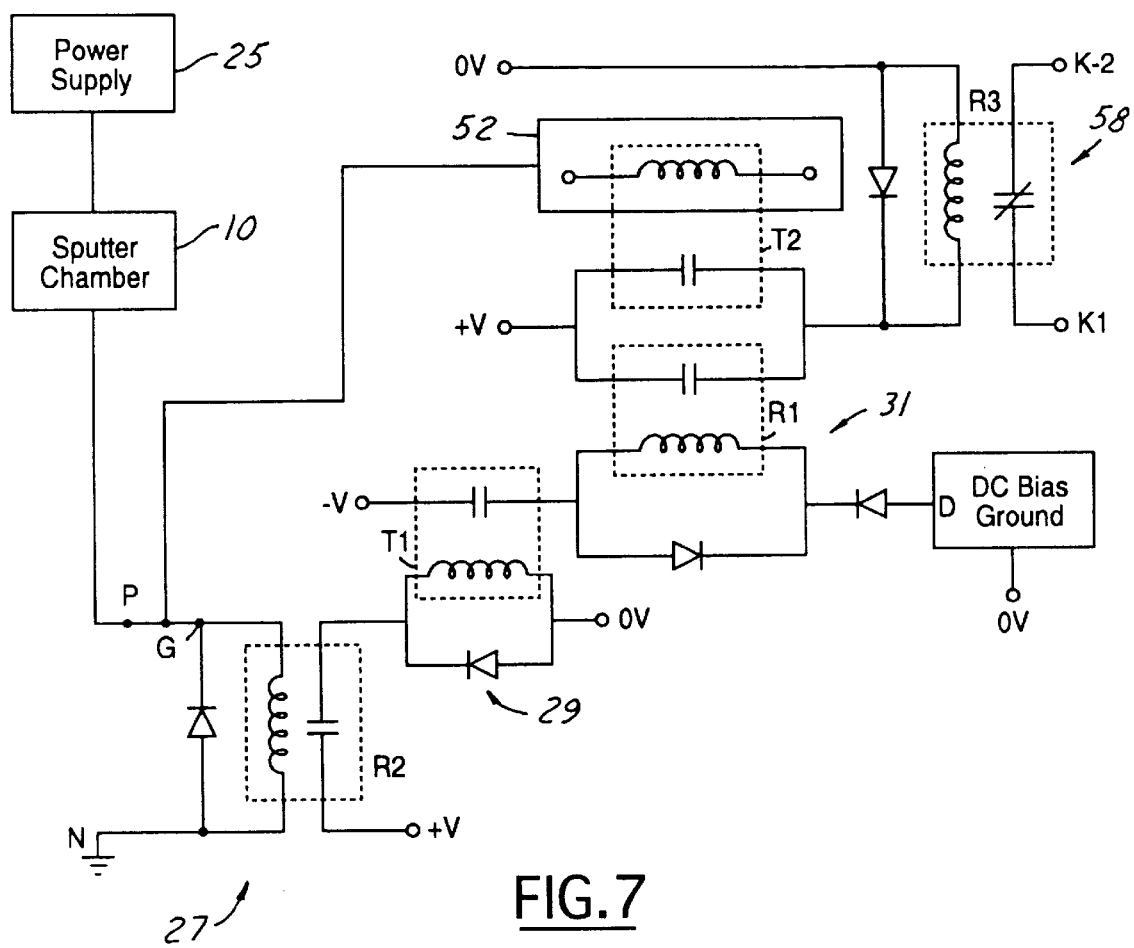
FIG. 7 is a combined block and detailed schematic diagram showing how the various circuits of FIGS. 3–6 are interconnected.

Reference is now made to FIGS. 4 and 6 which respectively depict the details of the first ground detection circuit 48, and of the interlock circuit 58, as well as FIG. 7 which shows how the various circuit portions are interconnected with each other. During the time period the reactant gas flows into the sputter chamber, there is a DC voltage of 24V at the PN terminals of a circuit 27 that contains a relay R2. The N terminal of circuit 27 is connected to ground, and the P terminal is connected to any suitable part of the internal circuitry of the sputter chamber that receives power when a sputter process cycle is commenced, i.e. when gas begins to flow into the chamber. This DC voltage present at the PN terminals energizes relay R2, causing the relay contacts R2 to close and thereby apply voltage to the timer relay T1 of circuit 29. Timer relay T1 is of the type well known in the art and used for many years which includes a timer component that holds the relay on for a preselected time period after it is first energized; when the timer component times out, the relay is automatically de-energized and is reset in readiness to be actuated again. Timer relay contacts T1 are coupled in a circuit that includes a relay R1 and a connection node D which represents an electrical connection to any appropriate part of the sputter chamber, such as the previously discussed pedestal or clamping ring, that will couple it to the dc bias circuit, thus allowing a grounding condition to be monitored. With timer relay T1 thusly energized, upon the closure of the R2 relay contacts, timer T1 starts timing, and the timer T1 contacts in circuit 31 are closed. Assuming, for example, that the timer T1 is set at 7 seconds, the T1 relay conducts electricity for 7 seconds during which period if there is a grounding condition existing in the chamber, the DC bias voltage at node D (inside the sputter chamber) and the ground are connected, thereby allowing current to flow through the relay R1. Energizing the R1 relay causes the R1 contacts in the interlock circuit (FIG. 6) to close, which in turn couples a voltage across the relay R3, thereby energizing the latter. The R3 relay opens its normally closed relay contacts R3 which are connected in a circuit with the contacts k1 and k2. Contacts k-1 and k-2 are coupled with internal circuits in the sputter apparatus that control its operation, consequently when the relay contact R3 opens, the internal circuits coupled with contacts k1 and k2 are opened, thereby resulting in the issuance of an alarm and the cutting off of power to the chamber. After the first time period of 7 seconds, the T1 timer cuts off the electrical connection such that the first ground detection circuit 48 is deactivated from the system.

The present invention first ground detection system 48 detects any grounding conditions in the chamber during the time reactant gas is flown into the chamber. In a sputter chamber that has been continuously operated, a thermal expansion of the chamber shield or the clamp ring may cause arcing between the already distorted parts. This type of shorting, or grounding condition exists before the plasma power to the sputter is turned on. The present invention first ground detection system therefore detects any grounding conditions in the sputter chamber in a first stage operation prior to the plasma deposition process for the film.

The present invention second stage ground detection circuit 52 (FIG. 2) operates in the following manner. After the first ground detection system 48 is deactivated after a first time period between about 5 seconds and about 10 seconds, and preferably after about 7 seconds, the reactant gas flow is remained on while the sputter deposition process starts by turning on the plasma power. A DC plasma is turned on to gently ignite a plasma cloud of the sputtered metal particles for depositing on the wafer. A suitable time period for the plasma deposition step is between about 20 seconds and about 70 seconds, depending on the thickness of the sputtered film desired.

At the start of the plasma deposition process, the plasma cloud which contains metal ions bombards on the wafer pedestal such that a DC bias voltage of about −27V DC is generated. Under normal conditions, an instantaneous bias voltage between about −400 and −500 V DC is first produced, the instantaneous voltage is then stabilized in a range between about −20 and about −30V DC. When the plasma power is turned on, metal ions bombarding the chamber components generate a large amount of heat and thus, further causing deformation of the chamber shield to touch the clamp ring and thus producing arcing. At the start of operation of the second ground detection circuit 52 (FIG. 2), the gas turn-on signal and the plasma on signal activate the second ground detection circuit such that it starts the detection task. During such detection, when a DC voltage of about −27V on the wafer pedestal suddenly disappears, a grounding or arching condition is indicated. The detection function of the second ground detection circuit 52 continues until the end of the plasma deposition process. At such time, the wafer is taken out of the sputter chamber such that another wafer can be placed into the chamber to start the next deposition cycle and the next ground detection cycle.

Figure 5:
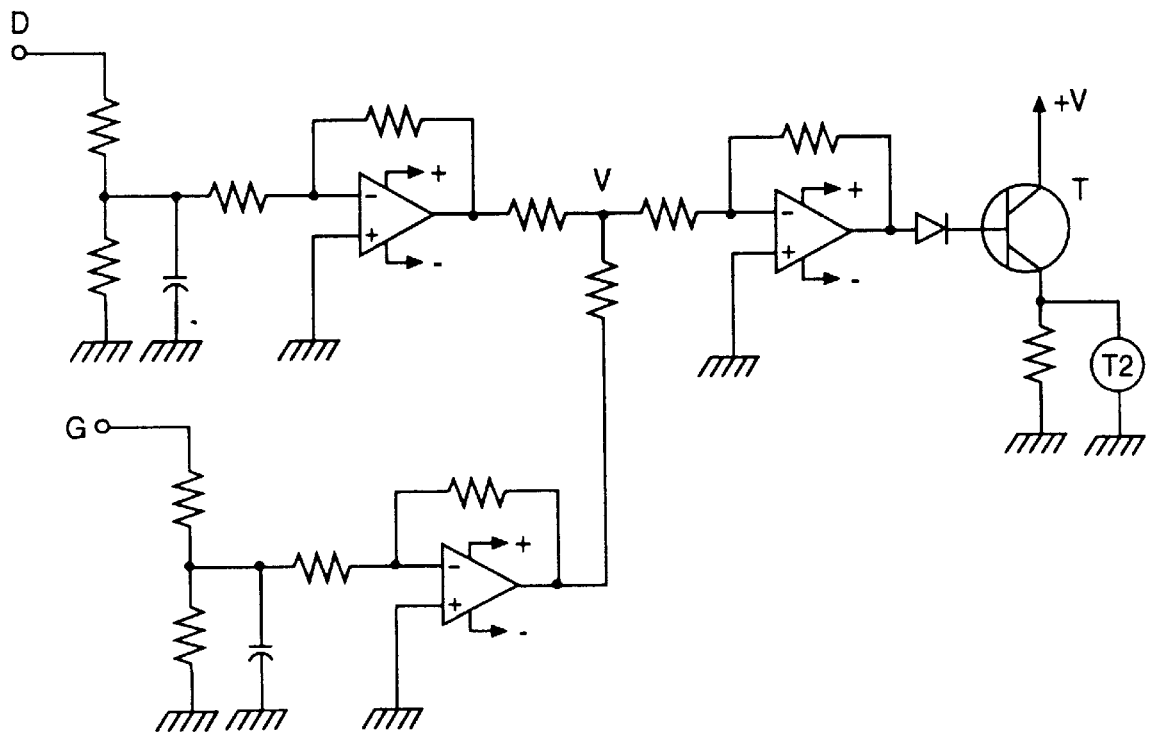
FIG. 5 is a circuit diagram for the present invention second ground detection circuit during a plasma deposition process.

Reference is now also made to FIG. 5 which depicts the details of the second ground detection circuit 52. At the start of the plasma deposition process, signals are input to both node D and node G. Node G forms a common connection with node P shown in FIGS. 1, 4 and 7, and node D is identical to the previously described node D that is also shown in FIGS. 1, 4 and 7. Consequently, one input (node D) to the second ground detection circuit is connected to the pedestal or clamping ring so as to be coupled with the previously described dc bias circuit, and the other input (node G) is connected in common with node P so as to receives a signal from the sputter chamber power supply 25 indicating that a process cycle has commenced. When a grounding condition is detected in the sputter chamber, i.e. when the node D and node G are connected in the dc bias circuit, the voltage of −27 V at node D disappears, thus causing the switching transistor T to be switched on. Switching on transistor T causes the timer relay T2 to be coupled with a voltage source +V. Energization of the timer relay T2 causes the normally open relay contacts T2 in the interlock circuit 58 (FIG. 6) to close. With relay contacts T2 closed in the interlock circuit 58, relay R3 is powered up, causing the normally closed relay contacts R3 to open, in turn opening the circuit connected to the k1, k2 contacts which triggers the alarm in the sputter chamber.

Figure 3:
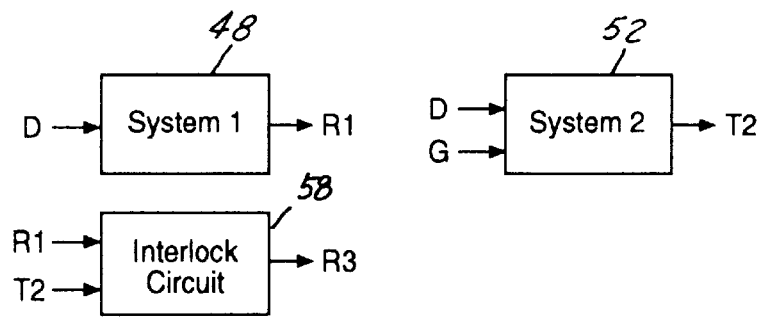
FIG. 3 is a block diagram showing the present invention ground detection monitoring system.

The interlock circuit utilized by the present invention novel apparatus can be described in FIGS. 3 and 6. In FIG. 3, the first ground detection circuit 48, the second ground detection circuit 52 and the interlock circuit 58 are shown. The input to the first and the second ground detection circuits are shown as D which is a DC bias voltage, and G which is a gas-on signal. The functions for the timer T2, and the relays R1 and R3 have been described. As shown in FIG. 6, when k-1 and k-2 are connected to relay R3, and when the first grounding circuit or the second grounding circuit detects a grounding condition in the sputter chamber, the interlock circuit 58 immediately process the signals received from the first or the second ground detection circuit and then outputting an alarm signal to the sputter chamber. When the sputter chamber receives the alarm signal, it indicates a "process gas stop DC power fault" alarm signal to put the sputter chamber on hold by interrupting its power supply. The control circuit shown in FIG. 6 therefore receives signals from the first and the second ground detection circuits (by utilizing an "OR" logic gate) if signals from either circuits is 1, the output from the control circuit is 1. The circuit of FIG. 6 utilizes R1 relay to drive the control circuit and to interrupt the power supply to the sputter chamber.

The results of detection by the present invention novel method and apparatus is also shown in Table 1.

TABLE 1

| D (V) | G (V) | Status |
|---|---|---|
| 0 | 0 | Machine down |
| −27 | −24 | Normal |
| 0 | −24 | Alarm |

It is seen that under normal operations with no grounding conditions occurring, there is −27V at node D and −24V at node G. When a zero voltage is detected at node D and a normal −24V is detected at node G, a grounding condition exists to sound the alarm. When the sputter chamber is down, both node D and node G exhibit zero voltage.

The present invention novel method and apparatus for detecting a grounding condition in a sputter chamber by two ground detection circuits and an interlock circuit have therefore been amply described and demonstrated in the above descriptions and the appended drawings of FIGS. 2~6.

While the present invention has been described in an illustrative manner, it should be understood that the terminology used is intended to be in a nature of words of description rather than of limitation.

Furthermore, while the present invention has been described in terms of a preferred embodiment and the alternate embodiments, it is to be appreciated that those skilled in the art will readily apply these teachings to other possible variations of the inventions.

The embodiment of the invention in which an exclusive property or privilege is claimed are defined as follows:

What is claimed is:

1. An apparatus for preventing arcing in a sputter chamber resulting from a grounding condition between a substrate clamping ring and a chamber component, comprising:

a first ground detection circuit for detecting said grounding condition between said substrate clamp ring and said chamber component only during a first time duration in which a reactant gas is flown into the sputter chamber, said first ground detection circuit for outputting a first signal to an interlock circuit when said grounding condition is detected to interrupt a power supply to the sputter chamber, a second ground detection circuit for detecting the existence of said grounding condition only during a second time duration following said first duration and during which a plasma for deposition has been formed in said sputter chamber, said second ground detecting circuit for outputting a second signal to said interlock circuit when said grounding condition is detected to interrupt the power supply to the sputter chamber, and said interlock circuit receiving said first signal or said second signal and outputting a third signal to interrupt a power supply to the sputter chamber before arcing.

2. An apparatus for preventing arcing in the sputter chamber according to claim 1, wherein said first ground detection circuit includes first means including a timer for disabling of said first ground detection circuit after a first preselected period of time and said second ground detection circuit includes second means including a timer for disabling said second ground detection circuit after a second preselected period of time.

3. An apparatus for preventing arcing in the sputter chamber according to claim 1, wherein said first ground detection circuit being operational during a reactant gas turn-on period between 5 seconds and 10 seconds.

4. An apparatus for preventing arcing in the sputter chamber according to claim 1, wherein said second ground detection circuit being operational only after said reactant gas has been turned-on for 10 seconds.

5. An apparatus for preventing arcing in the sputter chamber according to claim 1, wherein said first ground detection circuit operates by detecting a DC bias voltage on a wafer pedestal such that a first signal to an interlock circuit is outputted when said voltage detected is below a preselected voltage level.

6. An apparatus for preventing arcing in the sputter chamber according to claim 1, wherein said second ground detection circuit operates by detecting a DC bias voltage on a wafer pedestal such that a second signal to an interlock circuit is outputted when said voltage detected is a preselected voltage level.

7. An apparatus for preventing arcing in the sputter chamber according to claim 1, wherein said first ground detection circuit operates by detecting a DC bias voltage on a wafer pedestal such that a first signal to an interlock circuit is outputted when said voltage detected is zero.

8. An apparatus for preventing arcing in the sputter chamber according to claim 1, wherein said second ground detection circuit operates by detecting a DC bias voltage on a wafer pedestal such that a second signal to an interlock circuit is outputted when said voltage detected is zero.

9. An apparatus for preventing arcing in the sputter chamber according to claim 1, wherein said first ground detection circuit detects said grounding condition prior in time before said second ground detection circuit.

10. An apparatus for preventing arcing in the sputter chamber according to claim 1, wherein said interlock circuit comprises an "OR" logic gate for outputting said third signal to interrupt the power supply to said sputter chamber when either the first signal or the second signal is received by said interlock circuit.

11. An apparatus for preventing arcing in the sputter chamber according to claim 1, wherein said first and second ground detection circuits comprise a timer and a relay.

12. An apparatus for preventing arcing in the sputter chamber according to claim 1, wherein said chamber component is a chamber shield.

13. A method for preventing arcing in a sputter chamber comprising the steps of:

providing a first ground detection circuit for detecting a grounding condition between a clamp ring and a chamber component, flowing a reactant gas into the sputter chamber while simultaneously activating said first ground detection circuit for at least 5 seconds, only while said reactant gas is flowing into the sputter chamber, outputting a first signal to an interlock circuit to interrupt a power supply to said chamber when a grounding condition is detected, providing a second ground detection circuit for detecting a grounding condition between said clamp ring and said chamber component, turning on a plasma source for sputter deposition in said chamber after said first ground detection circuit is deactivated, only while said plasma source has been turned on for sputter deposition, outputting a second signal to an interlock circuit to interrupt the power supply to said chamber when a grounding condition is detected, and providing an interlock circuit for outputting a third signal to interrupt the power supply to the sputter chamber upon receiving said first signal or said second signal.

14. A method for preventing arcing in the sputter chamber according to claim 13, wherein said chamber component is a chamber shield positioned juxtaposed to said clamp ring.

15. A method for preventing arcing in a sputter chamber according to claim 13, wherein said first ground detection circuit is activated between 5 seconds and 10 seconds.

16. A method for preventing arcing in the sputter chamber according to claim 13, wherein said plasma source is turned on for sputter deposition for a time period between 20 seconds and 70 seconds during which the second ground detection circuit is activated.

17. A method for preventing arcing in the sputter chamber according to claim 13, wherein said second ground detection circuit is activated only after said first ground detection circuit is deactivated.

18. A method for preventing arcing in the sputter chamber according to claim 13 further comprising the step of outputting said first signal from said first ground detection circuit to said interlock circuit when a DC bias voltage on a wafer pedestal detected is below a preselected voltage level.

19. A method for preventing arcing in the sputter chamber according to claim 13 further comprising the step of outputting the second signal from said second ground detection circuit to said interlock circuit when a DC bias voltage on a wafer pedestal detected is below a preselected voltage level.

20. A method for preventing arcing in the sputter chamber according to claim 13 further comprising the step of outputting said first or said second signal from said first or second ground detection circuit respectively to said interlock circuit when a DC bias voltage on a wafer pedestal detected is zero.

21. An apparatus for preventing arcing between a clamp ring and a chamber shield in a sputter chamber comprising:

a sputter chamber, a clamp ring and a chamber shield situated in said sputter chamber, a first ground detection circuit for detecting the occurrence of a grounding condition between the clamp ring and the chamber shield by monitoring a DC bias voltage on a wafer pedestal and outputting a first signal to an interlock circuit, said first ground detection circuit being activated only during a first time period when a reactant gas is flown into the sputter chamber, a second ground detection circuit for detecting the occurrence of an grounding condition between the clamp ring and the chamber shield by monitoring a DC bias voltage on a wafer pedestal and outputting a second signal to said interlock circuit, said second ground detection circuit being activated only a second time period when a power supply is turned on to ignite a gas plasma in the sputter chamber and after said first ground detection circuit has been deactivated, and said interlock circuit being adapted for receiving said first signal or said second signal and outputting a third signal to interrupt a power supply to the sputter chamber before the occurrence of arcing.

22. An apparatus for preventing arcing between said clamp ring and said chamber shield in said sputter chamber according to claim 21, wherein said clamp ring and said chamber shield are formed of an electrically conductive material.

23. An apparatus for preventing arcing between said clamp ring and said chamber shield in said sputter chamber according to claim 21, wherein said first signal is outputted from said first ground detection circuit when said DC bias voltage monitored on said wafer pedestal is below a preselected voltage level.

24. An apparatus for preventing arcing between said clamp ring and said chamber shield in said sputter chamber according to claim 21, wherein said first time period during which said first ground detection circuit being activated is between 5 seconds and 10 seconds after said reactant gas flow is turned on.

25. An apparatus for preventing arcing between said clamp ring and said chamber shield in said sputter chamber according to claim 21, wherein said second signal is outputted from said second ground detection circuit when said DC bias voltage monitored on said wafer pedestal is below a preselected voltage level.

26. An apparatus for preventing arcing between said clamp ring and said chamber shield in said sputter chamber according to claim 21, wherein said second time period during which said second ground detection circuit being activated is between 20 seconds and 70.

27. An apparatus for preventing arcing between said clamp ring and said chamber shield in said sputter chamber according to claim 21, wherein said first signal or said second signal is outputted from said first or said second ground detection circuit when said DC bias voltage monitored on said wafer pedestal is zero.

28. An apparatus for preventing arcing between said clamp ring and said chamber shield in said sputter chamber according to claim 21, wherein said second ground detection circuit is a delayed circuit which is activated only after said first ground detection circuit is deactivated.

* * * * *